THERMOELECTRIC GENERATOR APPARATUS

Filed Nov. 18, 1965

INVENTORS
ROBERT E. NORTON
EDWARD F. HAMPL, JR.
BY Carpenter, Kinney & Coulter
ATTORNEYS United States Patent Office 3,496,028
Patented Feb. 17, 1970

3,496,028

THERMOELECTRIC GENERATOR APPARATUS

Robert E. Norton, Minneapolis, and Edward F. Hampl, Jr., Cottage Grove, Minn., assignors to Minnesota Mining and Manufacturing Company, St. Paul, Minn., a corporation of Delaware Filed Nov. 18, 1965, Ser. No. 508,450
Int. Cl. H01v *1/32, 1/30*
U.S. Cl. 136—211 6 Claims

ABSTRACT OF THE DISCLOSURE

Apparatus for pressure-contact connections to the hot junctions of thermoelectric legs. The apparatus includes a thermally and electrically conductive connecting strap for joining at least two adjacent N- and P-type legs, an electrode for each thermoelectric leg against which the leg is biased, and a pivotable contact and support means between the electrode and strap; this latter means includes cooperating portions on the electrode and connecting strap and provides for pivoting of the electrode about at least one axis perpendicular to the longitudinal axis of the leg and for large-area contact between the electrode and strap.

This invention relates to thermoelectric generators and to apparatus in thermoelectric generators by which electrical and thermal connections are made to thermoelectric legs.

The power output of prior art thermoelectric generators has been reduced below their potential power output by difficulties in making electrical connection to the generators' thermoelectric legs. In an attempt to provide good electrical connection to the thermoelectric legs, both ends of the legs in some prior art generators have been metallurgically bonded to their electrodes. While these bonds have provided low-resistance ohmic contact between the legs and electrodes, the stresses produced in the legs bonded in this manner during operation of the generator (for example, by thermal expansion of the structural parts of the generator) have partially fractured the legs. As a result the legs themselves have developed an undesirably high electrical resistance.

In other prior art generators (see, for example, Elm et al., U.S. Pat. 3,075,030) the thermoelectric legs have been made to last longer by using pressure contact connection apparatus in which the leg was placed in longitudinal compression against a hot junction electrode member by biasing means acting through a movable, pivotable cold junction electrode to which the leg was metallurgically bonded. However, with these generators the electrical resistance at the hot junction interface was not predictable and frequently constituted a considerable portion of the total leg resistance. In general, the art has regarded generators that incorporate pressure contact connection apparatus as inherently possessing a greater resistance than the resistance exhibited at least initially by generators incorporating bonded contacts.

With this invention pressure contact connection apparatus has been made to produce connections of a conductivity approaching that obtained with metallurgical bonds, while not stressing the thermoelectric legs in the manner associated with bonded connections. The power output of a generator incorporating these improvements is greatly increased over that produced by prior art generators using similar thermoelectric materials. Further, the new generators maintain their output at a uniform level over a long life.

These results are accomplished through the incorporation in a thermoelectric generator of novel hot junction members against which the thermoelectric legs are biased.

A generator in which this hot junction apparatus is embodied includes in spaced relationship heat absorbing and heat dissipating members and an array of alternating N- and P-type thermoelectric legs between the two members. The hot and the cold junction apparatus thermally connect the legs to, and electrically insulate them from, the heat absorbing and heat dissipating members respectively, and electrically connect the legs in a series of thermocouples. As noted above, the cold junction apparatus includes a biased movable cold junction electrode that places the thermoelectric leg under longitudinal compression against the hot junction members.

The novel hot junction apparatus embodied in this generator includes an electrically and thermally conductive connecting strap that joins at least two adjacent N- and P-type thermoelectric legs of a thermocouple, and a hot junction electrode between each leg and the connecting strap it is biased against. Each hot junction electrode has one side against the connecting strap and the opposite side in intimate contact with essentially the whole transverse surface of the hot end of the leg. Pivotable contact and support means locate the electrodes with respect to the connecting strap and adapt the electrodes to pivotal movement about at least one axis perpendicular to the longitudinal axis of the legs. Under normal, high-temperature operating conditions of the generator, intimate large-area contact between the electrodes and connecting strap and between the electrodes and legs is obtained.

Figure 1:
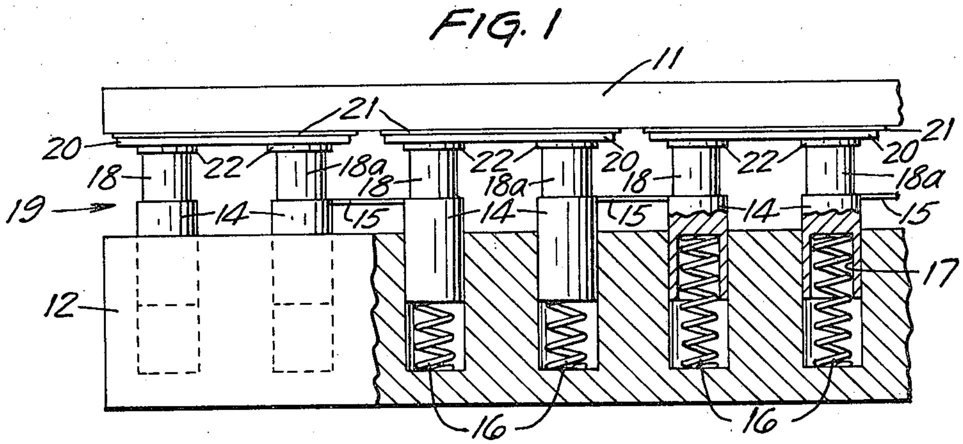
FIGURE 1 is a side elevation of a portion of a subassembly of a thermoelectric generator of this invention.

The subassembly of a thermoelectric generator shown in FIGURE 1 includes a metal, heat absorbing member 11, typically of stainless steel. A source of heat such as a gas burner impinges on a surfaces of the plate 11, shown as the top surface in the drawing, when the subassembly is incorporated in a generator. Spaced from the heat absorbing member 11 is a heat dissipating member 12, typically of a highly thermally conductive material such as aluminum. Heat dissipating apparatus, such as a plurality of fins, should be incorporated with the heat dissipating member in a generator.

Cylindrical bores 13, formed in the heat-dissipating plate 12, receive cylindrical cold junction electrodes 14 in a loose fit that permits the electrodes to slide, shift, and tilt. The cold junction electrodes for those thermoelectric legs that are not electrically connected through the hot junction connection apparatus are electrically connected by conductive wires 15 that are soldered to the electrodes. A compression spring 16 fits within a central cavity 17 in the bottom of each electrode 14 and biases the electrode against one of an array of alternating N- and P-type thermoelectric legs, 18 and 18*a* respectively. The legs, in turn, are biased against hot junction apparatus generally designated as 19.

Figure 2:
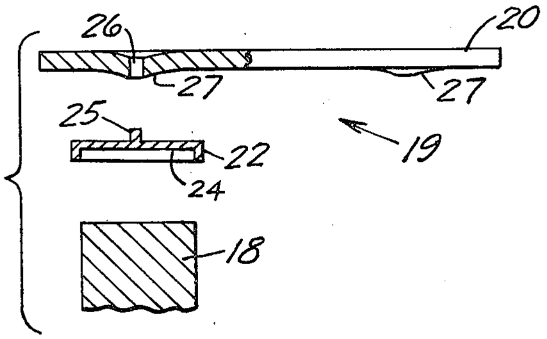
FIGURE 2 is an enlarged, exploded, side elevation of the hot junction members of a thermoelectric generator of this invention.

The hot junction apparatus 19 includes a connecting strap 20 for each two adjacent P- and N-type thermoelectric legs. The strap is separated from the heat absorbing member 11 by an insulating layer 21 such as a mica sheet that thermally connects the strap to, and electrically insulates it from, the member 11. The strap is formed of a plastically-deformable and electrically and thermally conductive metal such as copper. An electrically and thermally conductive hot junction electrode 22 is positioned between each thermoelectric leg 18 and 18*a* and the connecting strap 20 and is formed as a circular disk that has a flat-bottom, cylindrical recess 24 on one side adapted to intimately contact the transverse surface of the end of a leg. On the other side of the electrode is a short pin 25 that fits loosely in an aperture 26 in the connecting strap 20 and locates the electrode with respect to the strap 20. In the preassembled condition of the parts shown in FIGURE 2, a protuberance 27 initially exists around the aperture 26 on the bottom surface of the connecting strap 20; in this case the protuberance is formed by indenting the strap.

Figure 3:
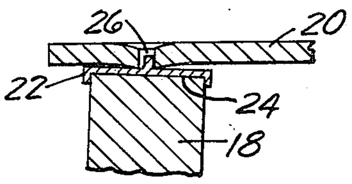
FIGURE 3 is an enlarged side elevation of hot junction members as shown in FIGURE 2 in an initial assembled relationship.

FIGURE 3 illustrates a representative initial position of the hot junction parts the first time the generator is operated. The hot junction electrode 22 is shown pivoted slightly as a result possibly of variations in the size of parts making up the generator, misalignment of the parts, movement of the parts owing to thermal expansion, and so forth. Pivoting of the hot junction electrode in response to such factors is important even during the initial period of operation of the generator to achieve intimate junctions. It has been found that a preferable manner of providing a useful pivotable hot junction electrode is to support the electrode against a deformable connecting strap and against a protuberant part on the strap as shown.

Figure 4:
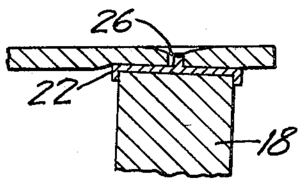
FIGURE 4 is an enlarged side elevation of hot junction members as shown in FIGURE 2 in assembled relationship under normal, high-temperature operating conditions.

The position of the parts generally continues to shift as the generator is heated. Under the influence of the high temperature of operation and the bias of the springs 16 and other stresses within the system acting through the thermoelectric leg on the hot junction electrode 22, the strap deforms and the electrode finds a position balancing the forces on it. To achieve a stable, low-resistance, intimate connection as illustrated by one possible position of the parts shown in an exaggerated manner in FIGURE 4, the generator should initially be heated rather rapidly to an elevated temperature, typically higher than the normal operating temperature, and operated there for some time until the resistance of the generator is reduced to a constant value. The time required will vary depending on the plastic properties of the thermoelectric materials and materials of the connecting members, the amount of pressure applied to the thermoelectric legs, and the temperature of operation. However, once the generator parts have been aligned, the generator may be thermally cycled, and though part of the transverse surface of the end of the leg may pull slightly away from the electrode when the leg is cooled, essentially all of the transverse surface of the end of the leg will again contact the electrode under normal, high-temperature operation.

Figure 5:
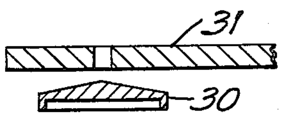
FIGURE 5 is an enlarged, exploded, side elevation of hot junction members of a different embodiment of this invention.
Figure 6:
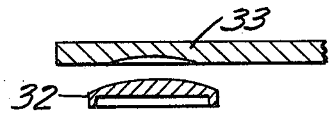
FIGURE 6 is an enlarged, exploded, side elevation of hot junction members of a different embodiment of this invention.

Other arrangements of hot junction parts taught by this invention are represented by those illustrated in FIGURES 5 and 6. In the arrangement shown in FIGURE 5 an electrode 30 having a conically-shaped side is supported against an apertured, plastically-deformable connecting strap 31. The electrode pivots as the slanted surfaces of the protuberant, conically-shaped part of the electrode slide along the edges of the aperture and the edges of the connecting strap around the aperture deform. FIGURE 6 shows an electrode 32 having a spherically-shaped protuberant part that fits in a spherically-shaped recess in a connecting strap 33. The connecting strap is preferably deformable, though precision ball and socket arrangements produce useful results even if the socket is not formed in a deformable metal. In other arrangements the electrode is deformable and the connecting strap either deformable or not deformable.

In a specific embodiment of the kind illustrated in FIGURES 1–4, the thermoelectric legs 18 and 18*a* were metallurgically bonded to the cold junction electrodes 14. The latter had about a 0.9 centimeter diameter and the bores 13 in which they were placed had about a 0.905 centimeter diameter. The springs 16 exerted 10 kilograms/square centimeter pressure on the thermoelectric legs. The connecting straps 20 were iron-coated electrolytic copper and had a thickness of 2 millimeters. The apertures 26 had a diameter of about 2 millimeters and the protuberance 27 was raised above the rest of the bottom surface of the plate 27 by about 0.5 millimeter. The electrodes 22 were mild steel and had an outside diameter of about 1 centimeter. The recess 24 had a diameter of about 0.91 centimeter and a depth of about 1 millimeter and the pin had a diameter of about 1.5 millimeters. The ends of the thermoelectric legs had a diameter of 0.9 centimeter. The member 12 was an anodized aluminum block, and the member 11 was stainless steel and a 0.1-millimeter sheet of mica separated the plate 20 and member 11.

We claim:

1. Improved hot junction means for a thermoelectric generator of the type that includes (in spaced relationship)

(1) a head absorbing and a heat dissipating member in spaced relationship, (2) an array of alternating N- and P-type thermoelectric legs between said two members, and (3) hot and cold junction means (a) electrically connecting the legs in a series of thermocouples and (b) thermally connecting the legs to, while electrically insulating them from, the heat absorbing and heat dissipating members respectively, the cold junction means including a biased movable cold junction electrode placing the legs under longitudinal compression against the hot junction means, said improved hot junction means comprising (a) an electrically and thermally conductive connecting strap for joining at least two adjacent N- and P-type legs (and against which each of said legs is biased), (1′) each connecting strap being thermally connected to, while electrically insulated from, the heat absorbing member, and (2′) each of said adjacent N- and P-type legs being biased in the direction of the strap, (b) an electrically and thermally conductive hot junction electrode between each leg and its connecting strap, each hot junction electrode having one side against the strap and its opposite side in intimate contact with essentially the whole transverse surface of the hot end of the leg, and (mounting means for)

(c) pivotable contact and support means having cooperating portions on each hot junction electrode and its connecting strap, said means (1′) aligning the hot junction electrode(s) with respect to the strap, (2′) adapting the hot junction electrode(s) to pivotal movement about at least one axis perpendicular to the longitudinal axis of the leg biased against it, and (3′) providing at least under normal high-temperature operation of the generator intimate large-area contact between the hot junction electrode(s) and strap.

2. The hot junction means of claim 1 in which the connecting strap is plastically deformable and the (mounting) pivotable contact and support means includes (1) a short pin on the electrode(s)

(2) a recess in the connecting strap in which the pin loosely fits, and (3) an annular protuberant part formed in the connecting strap around said recess, the protuberant part abutting the surface of the electrode and supporting the electrode for pivotal movement about at least one axis perpendicular to the longitudinal axis of the leg.

3. The hot junction means of claim 2 in which the connecting strap is a plastically deformable iron-coated copper plate.

4. The hot junction means of claim 1 in which the pivotable contact and support means includes a protuberant part formed in one of the strap and hot junction electrode, said protuberant part (a) abutting the surface of the other of the strap and electrode and (b) supporting the electrode for pivotal movement about at least one axis perpendicular to the longitudinal axis of the leg, at least one of the connecting strap and electrode being operating conditions of the generator to provide intimate large-area contact between it and the other of the electrode and strap.

5. The hot junction means of claim 1 in which the connecting strap is plastically deformable and the pivotable contact and support means includes a conically shaped portion on the side of the hot junction electrode that is against the connecting strap, and a narrow recess in the connecting strap in which the point of the conically shaped portion is received.

6. The hot junction means of claim 1 in which the pivotable contact and support means includes a protuberant part on the side of the hot junction electrode that is against the connecting strap and a depression in the connecting strap in which the protuberant part is received; the protuberant part on the electrode being convexly curved in the manner of the edge of a sphere and the depression in the connecting strap being correspondingly concavely curved to receive the protuberant part.

References Cited

UNITED STATES PATENTS

| | | | |
|---|---|---|---|
| 3,304,207 | 2/1967 | Kolb | 136—211 |
| 3,269,875 | 8/1966 | White | 136—212 |
| 3,075,030 | 1/1963 | Elm et al. | 136—208 |

ALLEN B. CURTIS, Primary Examiner

PO-1050
(5/69)

UNITED STATES PATENT OFFICE
CERTIFICATE OF CORRECTION

Patent No. 3,496,028 Dated February 17, 1970

Inventor(s) Norton, Robert E. and Hampl, Jr., Edward F.

It is certified that error appears in the above-identified patent and that said Letters Patent are hereby corrected as shown below:

Claims 1, 2, and 4 should read as follows:

1. Improved hot junction means for a thermoelectric generator of the type that includes
   (1) a heat absorbing and a heat dissipating member in spaced relationship,
   (2) an array of alternating N- and P-type thermoelectric legs between said two members, and
   (3) hot and cold junction means
      (a) electrically connecting the legs in a series of thermocouples and
      (b) thermally connecting the legs to, while electrically insulating them from, the heat absorbing and heat dissipating members respectively, the cold junction means including a biased movable cold junction electrode placing the legs under longitudinal compression against the hot junction means, said improved hot junction means comprising
   (a) an electrically and thermally conductive connecting strap for joining at least two adjacent N- and P-type legs,
      (1') each connecting strap being thermally connected to, while electrically insulated from, the heat absorbing member, and
      (2') each of said adjacent N- and P-type legs being biased in the direction of the strap,
   (b) an electrically and thermally conductive hot junction electrode between each leg and its connecting strap,
      each hot junction electrode having one side against the strap and its opposite side in intimate contact with essentially the whole transverse surface of the hot end of the leg, and
   (c) pivotable contact and support means having cooperating portions on each hot junction electrode and its connecting strap, said means
      (1') aligning the hot junction electrode with respect to the strap,

PO-1050
(5/69)

UNITED STATES PATENT OFFICE
CERTIFICATE OF CORRECTION

Patent No. 3,496,028 Dated February 17, 1970

Inventor(s) Norton, Robert E. and Hampl, Jr., Edward F.

It is certified that error appears in the above-identified patent and that said Letters Patent are hereby corrected as shown below:

(2') adapting the hot junction electrode to pivotal movement about at least one axis perpendicular to the longitudinal axis of the leg biased against it, and
(3') providing at least under normal high temperature operation of the generator intimate large-area contact between the hot junction electrode and strap.

2. The hot junction means of claim 1 in which the connecting strap is plastically deformable and the pivotable contact and support means includes
(1) a short pin on the electrode,
(2) a recess in the connecting strap in which the pin loosely fits, and
(3) an annular protuberant part formed in the connecting strap around said recess,
the protuberant part abutting the surface of the electrode and supporting the electrode for pivotal movement about at least one axis perpendicular to the longitudinal axis of the leg.

4. The hot junction means of claim 1 in which the pivotable contact and support means includes a protuberant part formed in one of the strap and hot junction electrode, said protuberant part
(a) abutting the surface of the other of the strap and electrode and
(b) supporting the electrode for pivotal movement about at least one axis perpendicular to the longitudinal axis of the leg,
at least one of the connecting strap and electrode being plastically deformable under normal high-temperature operating conditions of the generator to provide intimate large-area contact between it and the other of the electrode and strap.

SIGNED AND
SEALED

JUL 7 1970

(SEAL)
Attest:

Edward M. Fletcher, Jr.
Attesting Officer

WILLIAM E. SCHUYLER, JR.
Commissioner of Patents